United States Patent
Hata

(10) Patent No.: US 8,772,085 B2
(45) Date of Patent: Jul. 8, 2014

(54) INTEGRATED CIRCUIT PACKAGE ARCHITECTURE

(75) Inventor: William Y. Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 52 days.

(21) Appl. No.: 13/416,163

(22) Filed: Mar. 9, 2012

(65) Prior Publication Data

US 2012/0159779 A1 Jun. 28, 2012

Related U.S. Application Data

(62) Division of application No. 12/533,997, filed on Jul. 31, 2009, now Pat. No. 8,148,813.

(51) Int. Cl.
*H01L 21/44* (2006.01)

(52) U.S. Cl.
USPC .................................. 438/109; 257/E21.499

(58) Field of Classification Search
USPC .......................................... 438/109, 598, 599
See application file for complete search history.

(56) References Cited

U.S. PATENT DOCUMENTS

| 6,777,794 B2 * | 8/2004 | Nakajima | 257/686 |
| 2004/0007768 A1 * | 1/2004 | Byers et al. | 257/666 |
| 2009/0091008 A1 * | 4/2009 | Mizukami | 257/666 |

* cited by examiner

*Primary Examiner* — Chandra Chaudhari
(74) *Attorney, Agent, or Firm* — Womble Carlyle Sandridge & Rice LLP

(57) ABSTRACT

A packaging architecture for an integrated circuit is provided. The architecture includes a printed circuit board and a package substrate disposed on the printed circuit board. A first integrated circuit is disposed on a first surface of the package substrate. The package substrate is capable of supporting a second integrated circuit. The second integrated circuit is in electrical communication with a plurality of pads disposed on the first surface of the package substrate. Each of the plurality of pads is in electrical communication with the printed circuit board without communicating with the first integrated circuit.

20 Claims, 5 Drawing Sheets

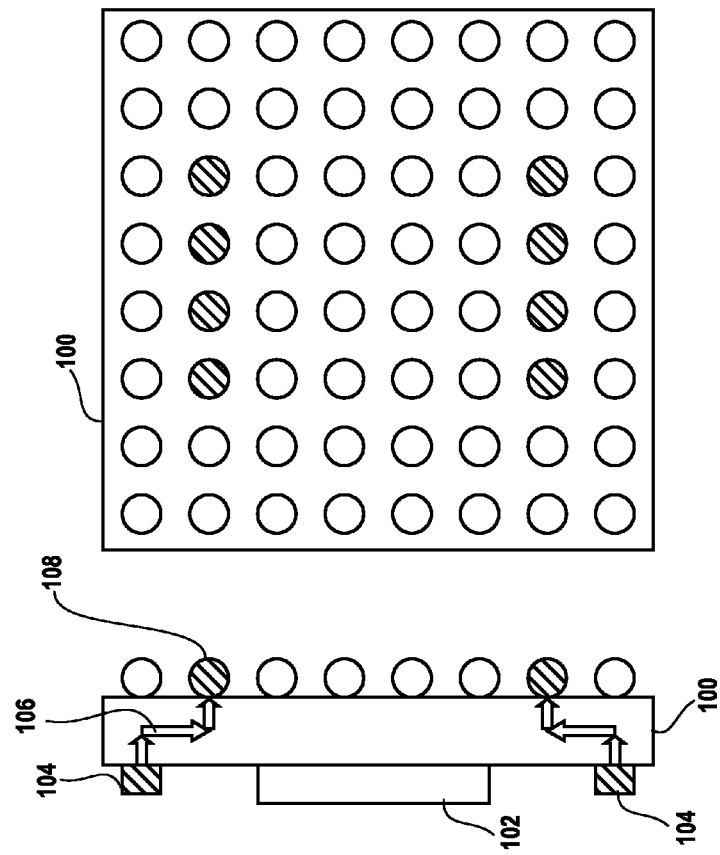
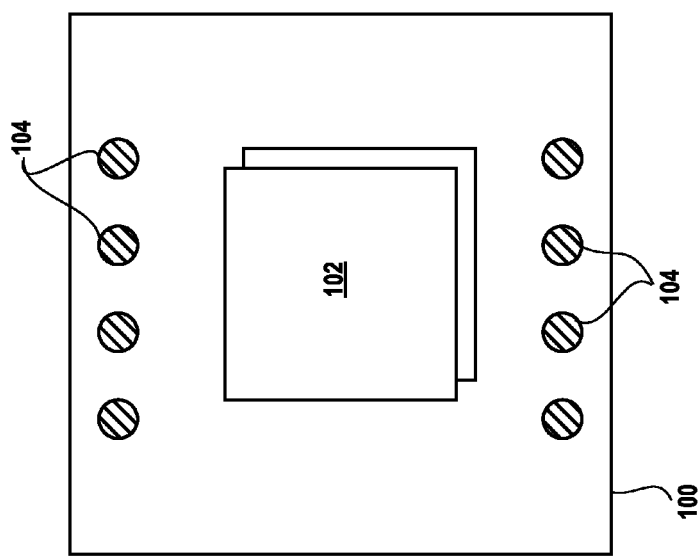
FIG. 1C
FIG. 1B
FIG. 1A

INTEGRATED CIRCUIT PACKAGE ARCHITECTURE

PRIORITY

This application is a divisional application of U.S. application Ser. No. 12/533,997, filed Jul. 31, 2009 now U.S. Pat. No. 8,148,813. The disclosure of this related application is incorporated herein by reference for all purposes.

BACKGROUND

Some integrated circuits may be designed to function with another device, e.g., a memory chip, a co-processor, etc. Different combinations of the two devices are possible, e.g., different amounts of memory, operating frequencies, or even the ability to function without the secondary device. Packages for the different combinations tend to add to the overall cost and as such, there are continual efforts to reduce the costs for the packaging.

One exemplary application is with regard to programmable logic devices and the configuration stored in an external device, such as one or more non-volatile memory chips. The different package formats for the devices, or combination of devices, add to the inventory management overhead, in addition to requiring customized bills of materials for the owner of the programmable logic device. Along with the different package formats, different testing requirements are incurred further adding to costs. It is desirable to reduce the inventory overhead yet maintain the flexibility offered through alternative package formats.

It is within this context that the embodiments described herein arise.

SUMMARY

The embodiments described herein provide for a small form factor integrated circuit and accompanying configuration unit. It should be appreciated that the present invention can be implemented in numerous ways, such as a process, an apparatus, a system, a device or a method on a computer readable medium. Several inventive embodiments of the present invention are described below.

In one aspect of the invention, a packaging architecture for an integrated circuit is provided. The architecture includes a printed circuit board and a package substrate disposed on the printed circuit board. A first integrated circuit is disposed on a first surface of the package substrate. The package substrate is capable of supporting a second integrated circuit. The second integrated circuit is in electrical communication with a plurality of pads disposed on the first surface of the package substrate. Each of the plurality of pads is in electrical communication with the printed circuit board without communicating with the first integrated circuit. Consequently, the second integrated circuit communicates with the first integrated circuit, solely through the printed circuit board. In one embodiment, the first integrated circuit is a programmable logic device and the second integrated circuit stores a configuration utilized by the programmable logic device. In another embodiment, the second integrated circuit is disposed above the first integrated circuit.

In another aspect of the invention, a method of packaging an integrated circuit is provided. The method initiates with coupling a first integrated circuit to a package substrate and then coupling a second integrated circuit to the package substrate. The second integrated circuit is disposed over the first integrated circuit in one embodiment. The method includes coupling the package substrate to a printed circuit board such that the second integrated circuit communicates data to the first integrated circuit exclusively through the printed circuit board prior to being delivered to the first integrated circuit. In one embodiment, the first integrated circuit is a programmable logic device and the second integrated circuit stores a configuration utilized by the programmable logic device.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 1A through 1C illustrate schematics showing different views for the integrated circuit and package substrate in accordance with one embodiment of the invention.

DETAILED DESCRIPTION

The embodiments described herein provide a package architecture for an integrated circuit. It will be obvious, however, to one skilled in the art, that the present invention may be practiced without some or all of these specific details. In other instances, well known process operations have not been described in detail in order not to unnecessarily obscure the present invention.

The embodiments described herein provide for a package layout that is compatible with external configuration devices without complicating inventory management for the package. In one embodiment, a package on package (POP) solution is utilized for the package architecture. The POP solution is capable of functioning in a standalone design as explained further below. In another embodiment, the configuration device can be supplied and attached by the owner of the integrated circuit. In yet another embodiment, the customer or end user may supply the configuration device. Irrespective of whether the configuration device is supplied by the owner of the integrated circuit or the customer, the configuration device can be either pre-programmed or programmed at a later time.

Figure 3A:
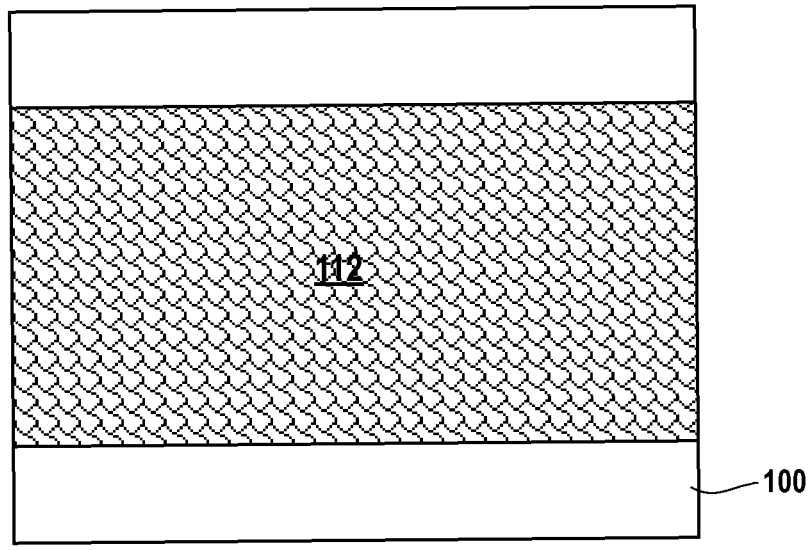
FIGS. 3A and 3B are simplified schematic diagrams illustrating the stacked layout of the integrated circuit and the corresponding configuration device in accordance with one embodiment of the invention.

FIGS. 1A through 1C illustrate schematics showing different views for the package layout in accordance with one embodiment of the invention. FIG. 1A is a simplified schematic diagram of the package layout from a top view. Integrated circuit 102 is disposed over package substrate 100. Package substrate 100 may include a plurality of landing pads 104 for a POP layout in accordance with one embodiment of the invention. It should be appreciated that integrated circuit 102 may be coupled to package substrate 100 through a plurality of solder balls, such as, a ball and grid array configuration. One skilled in the art will appreciate that alternative coupling techniques, besides the ball and grid array may be utilized as the ball and grid array is exemplary and not meant to be limiting. In one embodiment, a memory chip is disposed over the top of package configuration of FIG. 1 as illustrated in FIGS. 3A-4. FIG. 1B illustrates a side view of the integrated circuit and package substrate in accordance with one embodiment of the invention. As illustrated in FIG. 1B landing pads 104 are in electrical communication with a corresponding solder ball 108 disposed on an opposing surface of package 100. The embodiments described herein provide for a configuration device to be disposed over integrated circuit 102. The configuration device disposed over integrated circuit 102 does not include any communication pathways with integrated circuit 102 through package substrate 100. Thus, the communication pathway is between an integrated circuit disposed over the package layout of FIG. 1B and a printed circuit board affixed to the package substrate or some other external device in communication with the package substrate. In one embodiment, pathway 106 through package substrate 100 is a plated through hole. In another embodiment, pathway 106 through package substrate 100 utilizes the metallization layers defined within the package substrate. FIG. 1C is a bottom illustration of package substrate 100 in accordance with one embodiment of the invention. The bottom surface of package 100 provides a ball and grid array for communication with a printed circuit board in one embodiment.

Figure 2:
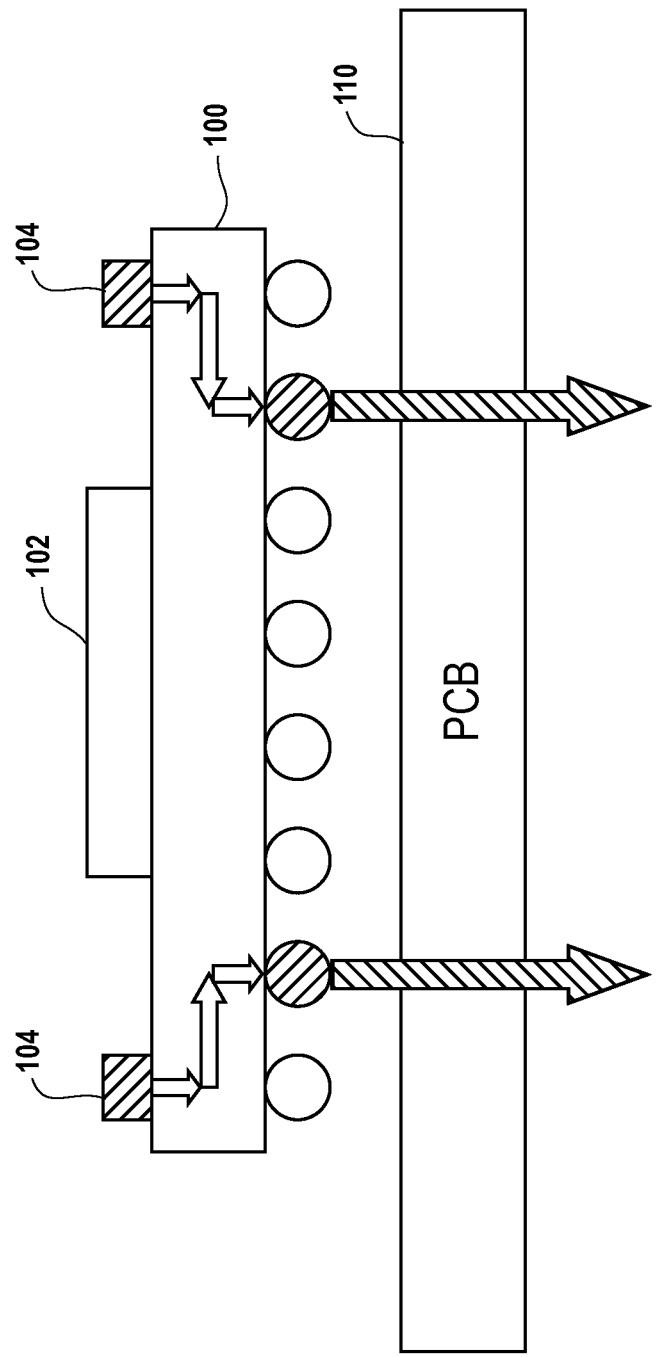
FIG. 2 is a simplified schematic diagram illustrating a standalone layout where landing pads on the package substrate designated for a second integrated circuit are exclusively in communication with a printed circuit board in accordance with one embodiment of the invention.

FIG. 2 is a simplified schematic diagram illustrating an exemplary package layout in accordance with one embodiment of the invention. In the package layout of FIG. 2, which may be referred to as a standalone layout, package substrate 100 has integrated circuit 102 disposed thereon. This layout is referred to as a standalone layout since the corresponding configuration device is not disposed over integrated circuit 102. In this embodiment the connections for the landing pads 104 through package substrate 100 and into printed circuit board 110 may be grounded to prevent any damage. In another embodiment the connections may be floating. It should be appreciated that in the layout illustrated with respect to FIG. 2, the Input/Outputs (I/Os) are all out board of the package on package (POP) design for simplified printed circuit board routing. One skilled in the art will appreciate that the embodiments are not limited to a POP configuration, as another chip, e.g., a memory chip, may be disposed adjacent to integrated circuit 102 as long as package substrate 100 is large enough to enable the side by side layout.

Figure 3B:
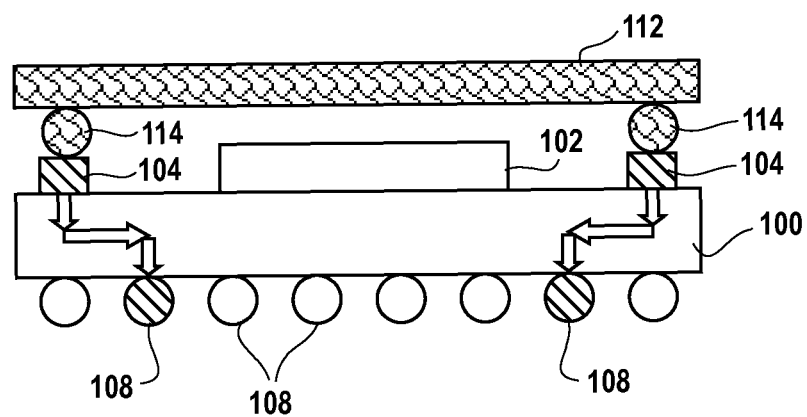
Figure 4:
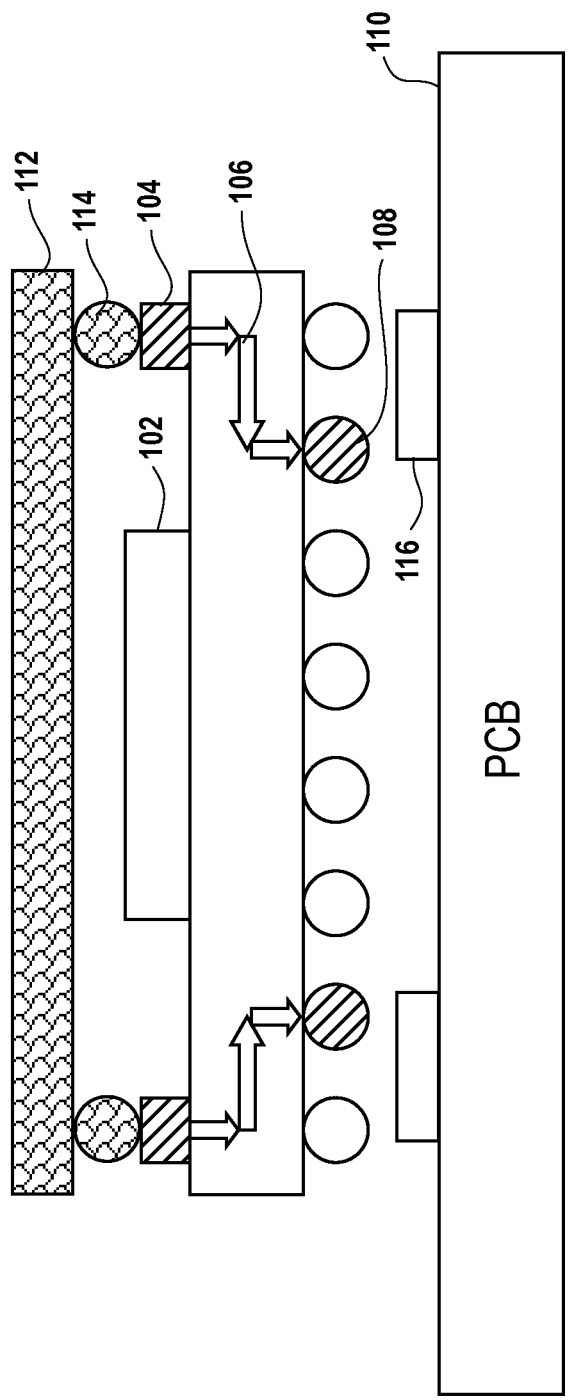
FIG. 4 is a simplified schematic diagram illustrating the stacked layout of FIGS. 3A and 3B coupled to a printed circuit board in accordance with one embodiment of the invention.

FIGS. 3A and 3B are simplified schematic diagrams illustrating the stacked layout of the integrated circuit and the corresponding configuration device in accordance with one embodiment of the invention. In FIG. 3A a top view of the package layout is provided. Configuration device 112 is disposed over package substrate 100. As mentioned above, configuration device 112 may be a memory chip that stores a configuration for integrated circuit 102. However, the embodiments are not limited to this specific design, as integrated circuit 102 may be any integrated circuit, such as a microprocessor or a programmable logic device (PLD), and configuration device 112 may be any suitable integrated circuit. FIG. 3B illustrates a side view of the stacked layout. Package substrate 100 includes a plurality of solder balls disposed on a bottom surface and is in communication with configuration device 112 through corresponding solder ball 114 and landing pad 104. Disposed between the bottom surface of configuration device 112 and the top surface of package substrate 100 is integrated circuit 102. As mentioned above integrated circuit 102 may be coupled to package substrate 100 through a ball and grid array as is known in the art. The electrical pathways connecting landing pad 104 and solder ball 108 proceeds through package substrate 100 without providing an electrical pathway to integrated circuit 102 through package substrate 100. That is, communication between configuration device 112 and integrated circuit 102 proceeds through a printed circuit board, or other external device, coupled to package substrate 100 through solder balls 108.

FIG. 4 is a simplified schematic diagram illustrating the stacked layout of FIGS. 3A and 3B coupled to a printed circuit board in accordance with one embodiment of the invention. Configuration device 112 is disposed over package substrate 100. Configuration device 112 is in electrical communication with package substrate 100 through solder ball 114 and landing pad 104. Printed circuit board 110 is in communication with corresponding solder balls 108 of package substrate through pads 116. It should be appreciated that the configuration device 112 will communicate with integrated circuit 102 through pathways within printed circuit board 110 or IO pins of printed circuit board 110 that are in communication with an external device. Thus, where configuration device 112 is a memory storing a configuration for an integrated circuit, such a PLD, configuration device 112 can be programmed prior to placement on package substrate 100, through direct connect pins after placement on package substrate 100, or on the printed circuit board as is conventionally done for in system programming.

Figure 5:
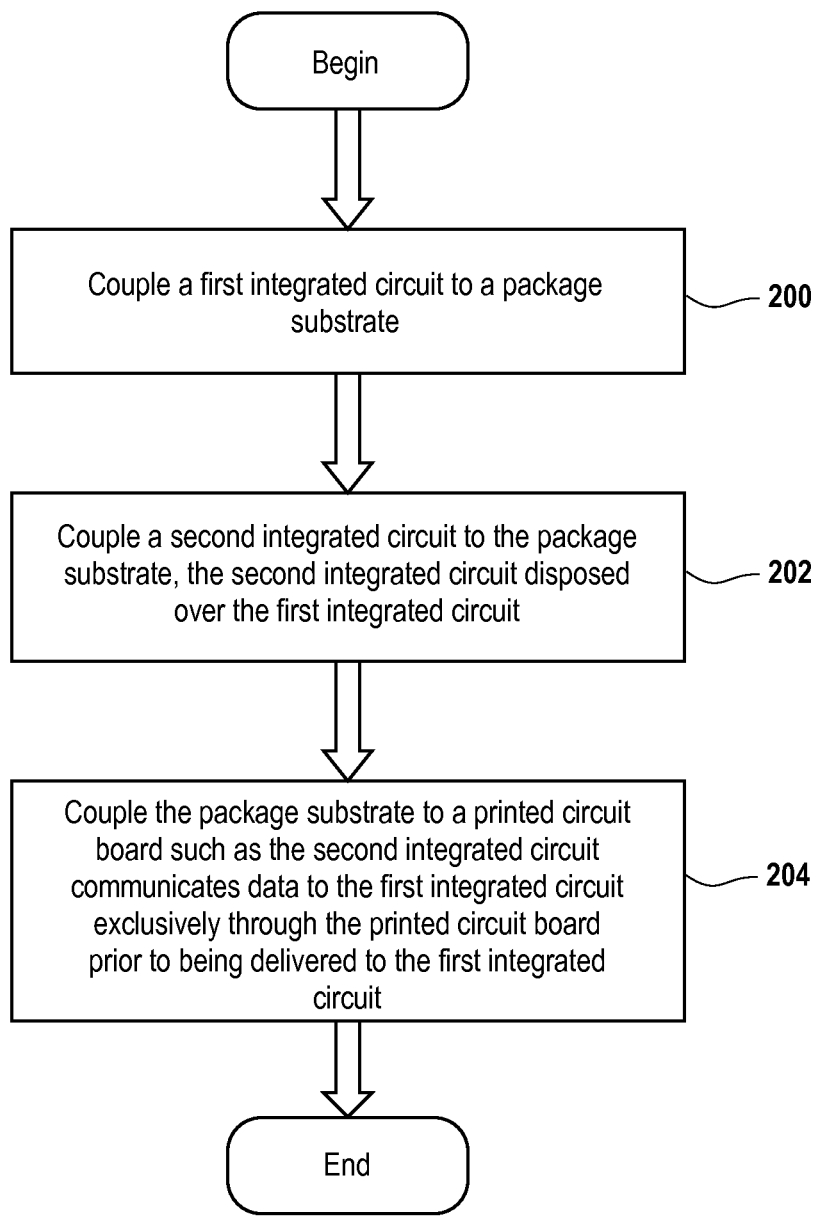
FIG. 5 is a flow chart diagram illustrating the method operations for packaging and integrated circuit in accordance with one embodiment of the invention.

FIG. 5 is a flow chart diagram illustrating the method operations for packaging and integrated circuit in accordance with one embodiment of the invention. The method initiates with operations 200 where a first integrated circuit is coupled to a package. As illustrated above, a programmable logic device may be coupled to a package substrate through conventional techniques known in the art in one embodiment of the invention. The method then advances to operation 202 where a second integrated circuit is coupled to the package substrate. The second integrated circuit is disposed over the first integrated circuit in accordance with one embodiment. It should be appreciated that the second integrated circuit may be alternatively disposed to a side of the first integrated circuit if the package substrate is large enough. In one embodiment, the second integrated circuit is disposed over the first integrated circuit in a package on package configuration. The method then advances to operation 204 for where the package substrate is coupled to a printed circuit board such that the second integrated circuit communicates data to the first integrated circuit exclusively through the printed circuit board. That is, the second integrated circuit does not communicate with the first integrated circuit directly through the package substrate since there are no pathways defining such communication between integrated circuit 102, package substrate 100 and configuration device 112. In one embodiment, the second integrated circuit may be coupled to the printed circuit board by a through via.

In summary, the embodiments describe a packaging architecture in which a package on package architecture is applied where the stacked integrated circuits do not directly communicate with each other through the package substrate supporting the stacked integrated circuits. The embodiments enable a single unit programmable logic device and configuration module, which assists in the management of inventory and allows for the utilization of third party configuration devices. The embodiments reduce costs for the package layout by reducing customized bills of material and inventory, thereby reducing the costs associated with this overhead. In addition, economies of scale are improved through a standalone design or a POP design. It should be appreciated that the capability of having the design either in the standalone format or the stacked or adjacent format further reduces the inventory and the customized bills of materials.

It should be appreciated that the embodiments are not meant to be limited to the exemplary references to a primary device being a programmable logic device and a secondary device being a configuration device for the programmable logic device. For example, one skilled in the art will appreciate that the embodiments may be incorporated with a memory chip, such as flash memory, and a processor, for a mobile device or any other small form factor device. The embodiments described herein enable the design of different amounts of memory without changing the package configuration to possibly differentiate product price points. Another application for the embodiments include with the use of a central processing unit (CPU), or any other suitable processor, and static random access memory (SRAM) cache for the two devices. Other exemplary applications include a CPU and co-processor. Thus, one of the devices does not necessarily have to be a memory chip. In essence, the embodiments are applicable to a primary device that can be used both with and without a secondary device. Through the embodiments described above where the secondary device communicates to the primary device exclusively through a printed circuit board and not the package substrate supporting the primary and secondary devices, the package architecture is simplified. In turn, the inventory management is also simplified by having a single package architecture capable of supporting distinguishable combinations.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Where the embodiments are applied to a programmable logic device, the programmable logic devices may refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method of packaging an integrated circuit, comprising:
   coupling a first integrated circuit to a package substrate;
   coupling a second integrated circuit to the package substrate, the second integrated circuit disposed over the first integrated circuit; and
   coupling the package substrate to a printed circuit board such that the second integrated circuit communicates data to the first integrated circuit exclusively through the printed circuit board prior to being delivered to the first integrated circuit.

2. The method of claim 1, wherein the first integrated circuit is a programmable logic device and the second integrated circuit is a memory device storing a configuration for operation of the first integrated circuit.

3. The method of claim 2, wherein the second integrated circuit is programmed with the configuration prior to being coupled to the package substrate.

4. The method of claim 1 further comprising:
   shorting coupling traces from the second integrated circuit to dual purpose I/O pins of the first integrated circuit.

5. The method of claim 1, comprising:
   routing each landing pad on the package substrate designated for coupling with the second integrated circuit directly to the printed circuit board.

6. The method of claim 1, further comprising:
   coupling the second integrated circuit to the printed circuit board by a through via of the package substrate.

7. The method of claim 1, further comprising:
   programming the second integrated circuit; and
   placing the second integrated circuit on the package substrate, after the programming.

8. The method of claim 1, further comprising:
   placing the second integrated circuit on the package substrate; and
   programming the second integrated circuit after the placing.

9. The method of claim 1, further comprising:
   applying in system programming to the second integrated circuit, after the package substrate is coupled to the printed circuit board.

10. The method of claim 1, further comprising:
    coupling the second integrated circuit to the printed circuit board by a plated through hole of the package substrate.

11. The method of claim 1, further comprising:
    coupling the second integrated circuit to the printed circuit board by a metallization layer in the package substrate.

12. A method of packaging an integrated circuit, comprising:
    coupling a first integrated circuit to a package substrate;

placing a second integrated circuit above the first integrated circuit;

coupling the second integrated circuit to the package substrate;

coupling the first integrated circuit to a printed circuit board, by the package substrate; and coupling the second integrated circuit to the printed circuit board, by the package substrate, wherein all communication from the first integrated circuit to the second integrated circuit and from the second integrated circuit to the first integrated circuit occurs by way of the printed circuit board.

13. The method of claim 12, further comprising:

storing, in the second integrated circuit, a configuration of the first integrated circuit, wherein the first integrated circuit includes a programmable logic device.

14. The method of claim 12, further comprising:

programming the second integrated circuit with a configuration of the first integrated circuit, wherein the first integrated circuit includes a programmable logic device.

15. The method of claim 12, further comprising:

designating a landing pad, on the package substrate, to couple with the second integrated circuit; and routing the landing pad to the printed circuit board, by the package substrate.

16. The method of claim 12, further comprising:

coupling the second integrated circuit to a through via of the package substrate; and coupling the through via to the printed circuit board.

17. The method of claim 12, further comprising:

programming a memory of the second integrated circuit, prior to coupling the second integrated circuit to the package substrate.

18. The method of claim 12, further comprising:

programming a memory of the second integrated circuit, after coupling the second integrated circuit to the package substrate.

19. The method of claim 12, further comprising:

applying in system programming to the second integrated circuit, by way of the printed circuit board and the package substrate.

20. The method of claim 12, further comprising:

coupling the second integrated circuit to the printed circuit board by one of: a plated through hole of the package substrate, or a metallization layer of the package substrate.

* * * * *